United States Patent [19]
Gulczynski

[11] Patent Number: 5,173,698
[45] Date of Patent: * Dec. 22, 1992

[54] FLASH ANALOG-TO-DIGITAL CONVERTER WITH INTEGRATING INPUT STAGE

[76] Inventor: Zdzislaw Gulczynski, P.O. Box 11633, Costa Mesa, Calif. 92627

[*] Notice: The portion of the term of this patent subsequent to Mar. 22, 2008 has been disclaimed.

[21] Appl. No.: 248,495

[22] Filed: Sep. 22, 1988

Related U.S. Application Data

[63] Continuation-in-part of Ser. No. 946,693, Dec. 24, 1986, abandoned.

[51] Int. Cl.[5] .................. H03M 1/36; H03M 1/56
[52] U.S. Cl. ............................. 341/158; 341/169
[58] Field of Search ........... 341/126, 127, 128, 129, 341/155, 156, 158, 159, 160, 161, 162, 164, 165, 166, 167, 168, 169, 170

[56] References Cited

U.S. PATENT DOCUMENTS

| | | | |
|---|---|---|---|
| 3,597,761 | 8/1971 | Fraschilla et al. | 341/156 |
| 3,820,111 | 6/1974 | Candy | 341/156 |
| 4,032,914 | 6/1977 | Candy et al. | 341/156 |
| 4,400,693 | 8/1983 | Flamm | 341/159 |
| 4,760,376 | 7/1988 | Kobayashi et al. | 341/155 |
| 4,789,862 | 12/1988 | Jackson | 341/155 |
| 4,794,374 | 12/1988 | Koike | 341/155 |

OTHER PUBLICATIONS

Millman, Mircroelectronics Digital and Analog Circuits and Systems 1979 McGraw-Hill, Inc. pp. 577 and 580.

Fujita, et al. A Bulk CMOS 20MS/S 7b Flash ADC, 1984 IEEE International Solid-State Circuits Conference pp. 56–57.

*Primary Examiner*—William M. Shoop, Jr.
*Assistant Examiner*—Howard L. Williams

[57] ABSTRACT

This flash analog-to-digital converter with integrating input stage has a very high speed and resolution due to drastically reduced number of components. The input signal is integrated for providing a varying ramp signal to comparators. A plurality of the comparator codes produced thereby is sampled, whereby a code sequence is established. A resistor or capacitor network determines quantization levels for the comparators so that the code sequence is different for any substantially different input signal. The code sequence is converted by means of an encoder, adder and decoder into the output code of the converter.

17 Claims, 6 Drawing Sheets

5,173,698

FLASH ANALOG-TO-DIGITAL CONVERTER WITH INTEGRATING INPUT STAGE

This is a continuation in part of application Ser. No. 946,693 filed Dec. 24, 1986, now abandoned.

This invention is related to the following inventions by the same inventor:

"Ultra Fast Logic with Temperature Compensation and Minimized Supply Voltage" Ser. No. 474,489 filed Feb. 2, 1990;

"Dual Flash Analog-to-Digital Converter" Ser. No. 316,592 filed Feb. 24, 1989;

"Dual Flash Analog-to-Digital Converter" Ser. No. 316,593 filed Feb. 24, 1989;

"Dual Flash Analog-to-Digital Converter" Ser. No. 316,594 filed Feb. 24, 1989;

"Ladderless True Flash Analog-to-Digital Converter with Automatic Calibration" Ser. No. 304,505 filed Jan. 31, 1989;

"Segmented Encoder and Digital Memory Particularly for Flash Analog-to-Digital Converters" Ser. No. 304,506 filed Jan. 31, 1989;

"Ultra Fast Digital-to-Analog Converter with Independent Bit Current Source Calibration" U.S. Pat. No. 4,958,155 dated Sep. 18, 1990;

"High Power Switching Power Supply with High Power Factor" Ser. No. 304,508 filed Jan. 31, 1989;

"High Power Switching Power Supply Having High Power Factor" U.S. Pat. No. 4,956,760 dated Sep. 11, 1990;

"High Accuracy Reference Ladder" U.S. Pat. No. 4,929,848 dated May 29, 1990;

"High Speed Integrating Analog-to-Digital Converter" filed herewith, now U.S. Pat. No. 4,940,982 dated Jul. 10, 1990;

"Encoder with Error Correction Particularly for Flash Analog-to-Digital Converters" Ser. No. 225,240 filed Jul. 28, 1988;

"Sample-and-Hold Amplifier with Controllable Source Charger" U.S. Pat. No. 4,980,686 dated Dec. 25, 1990;

"High Speed Integrating Digital-to-Analog Converter" Ser. No. 441,391 filed May 23, 1988;

"Ultra Fast Logic" U.S. Pat. No. 4,943,740 dated Jul. 24, 1990;

"High Speed Instrumentation Amplifier with Minimized Offset Voltage and Drift" U.S. Pat. No. 4,829,263 dated May 9, 1989;

"Digital-to-Analog Converter with Digital Correction" U.S. Pat. No. 4,843,392 dated Jun. 27, 1989;

"Flash Analog-to-Digital Converter" U.S. Pat. No. 4,763,106 dated Aug. 9, 1988;

"Dual Flash Analog-to-Digital Converter" U.S. Pat. No. 4,857,931 dated Aug. 15, 1989;

"Digital-to-Analog Converter" U.S. Pat. No. 4,811,017 dated Mar. 7, 1989;

"Digital-to-Analog Converter" U.S. Pat. No. 4,837,572 dated Jun. 6, 1989;

"Operational Amplifier or Comparator Circuit with Minimized Offset Voltage and Drift" U.S. Pat. No. 4,749,953 dated Jun. 7, 1988.

BACKGROUND OF THE INVENTION

The present invention generally relates to analog-to-digital converters (ADC), and particularly to the variety termed flash converters, for digital systems requiring high speed, high accuracy and high resolution conversion of an analog voltage or current into a corresponding digital output code.

Two parts can be distinguished in every flash ADC: an analog and digital sections. The analog section of the conventional N-bit flash ADCs consists of a reference source, K comparators connected in parallel and a chain of K (mostly K+1) equally valued resistors providing reference voltages thereto, whereby $K=2^N-1$. The digital section consists of an encoder for sampling comparator output signals, correcting faulty codes and providing binary output code. All ADCs are clocked.

The flash ADCs offer the fastest possible conversion as the quantization level of the input voltage is determined in a straightforward structure, particularly no feedback manipulating the input signal is used. They do suffer however from many problems, mostly originating from a very high circuit complexity. For instance, a 10-bit flash ADC demands 1023 comparators and number of switching elements comparable to a modern 16-bit microprocessor. A 16-bit ADC according to ordinary constructions is virtually impossible, requiring 65535 comparators not to mention other necessary components. Furthermore, the resistor network causes deficient long term and temperature stability, reduced speed and accuracy, enlarged chip space and increased power consumption, etc.

The huge number of the comparators in high resolution flash ADCs results in a very complex gate structure of the encoders. Certain kinds of errors caused by a false response of the comparators are not possible to correct due to technological limitations. Simplified error correction schemes result in missing codes. For instance, the flash ADCs have a tendency to miss a code every few billion conversions, i.e. several times a minute when ADC is sampling at 100 MHz.

An input track-and-hold amplifier (THA) is mandatory for optimizing speed and accuracy. Furthermore, an amplifier must be able to drive a large and varying input capacitance of the ADC.

SUMMARY OF THE INVENTION

The invention is intended to provide a flash ADC having a very high speed and resolution, drastically reduced number of components, high noise rejection, ability of averaging the input signal, inherent error correction, etc.

According to the present invention an ADC converts input signal into output code and comprises an integrator means for providing a ramp signal at a rate determined by the input signal, a source means for providing a reference signal, a first and second nodes separately coupled to the integrator means and ground in either order, a passive means coupled between the source means and first node for providing a plurality of signals, a plurality of comparator means for producing a comparator code, each comparator means having a first input receiving one of the passive means signals and a second input coupled to the second node, and a digital means for sampling and converting a plurality of the comparator codes into the output code.

In another embodiment the ADC comprises a current source means for providing a current determined by the input signal, a voltage source means for providing a reference voltage, a capacitor means coupled between the current and voltage source means for providing a plurality of signals, a plurality of comparator means for producing a comparator code, each comparator means having a first input receiving one of the capacitor means signals and a second input coupled to ground, and a digital means for sampling and converting a plurality of the comparator codes into the output code.

In yet another embodiment the digital means includes an encoder means for sampling and converting the comparator code into an encoder code, an adder/accumulator means for producing a sum of a plurality of the encoder codes, and a decoder means for converting the sum into the output code.

BRIEF DESCRIPTION OF THE DRAWINGS

The present invention will become more clear in conjunction with the accompanying figures of which.

Throughout the drawings similar references may denote similar parts.

DETAILED DESCRIPTION OF THE INVENTION

Figure 1:
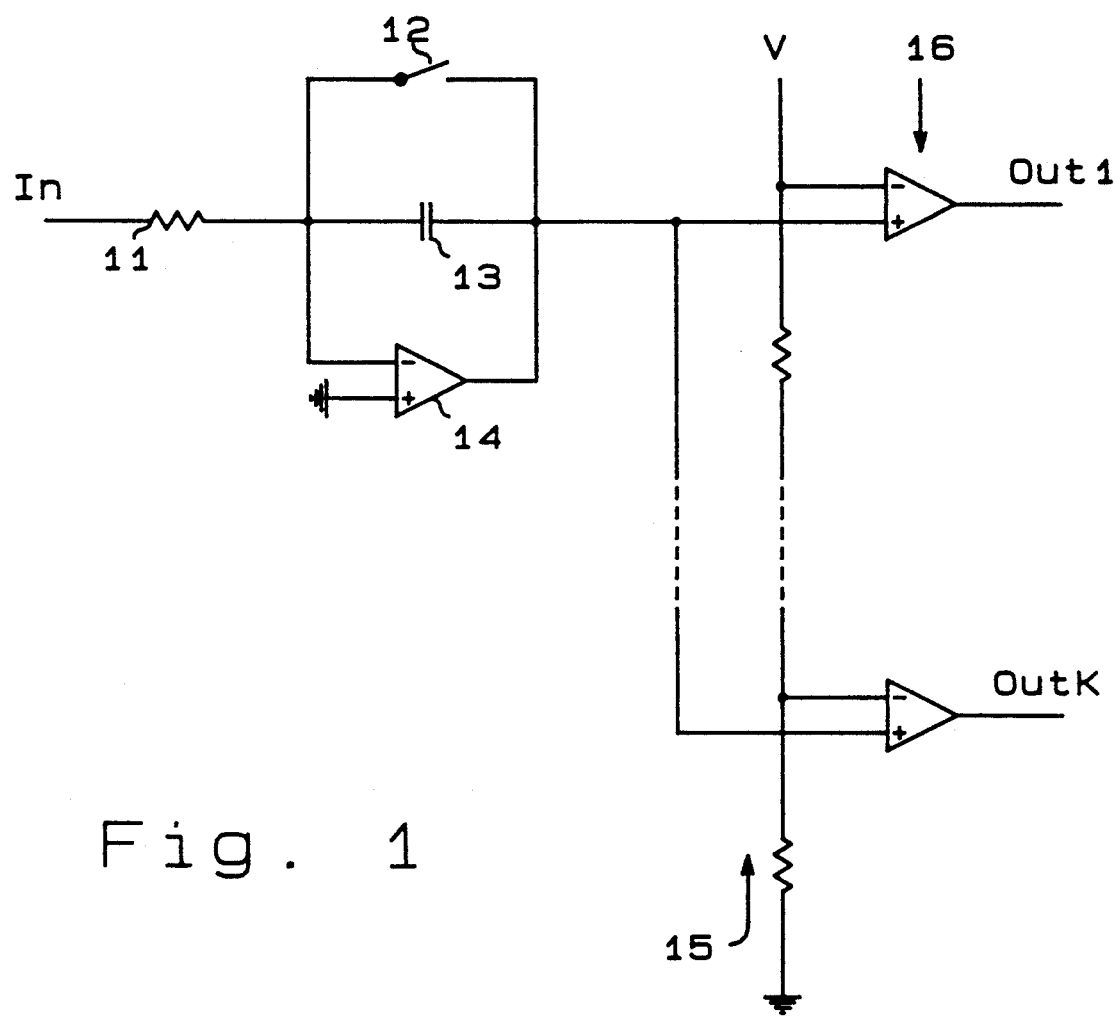
FIG. 1 is a basic structure of the analog section.

FIG. 1 is a basic structure of the analog section. The ADC input signal is applied to the integrator which provides a ramp signal. Specifically, the input signal is applied to the inverting input of the operational amplifier 14. The noninverting input thereof is coupled to ground. The capacitor 13 is coupled between the output and inverting input for integrating a current applied thereto which current is determined by the input signal. The optional resistor 11 is coupled between the ADC input and inverting input for attaining the current if a source providing the ADC input signal has a low output impedance. By these means the rate of integration is determined by the input signal. The integrator is reset before a new conversion as the capacitor 13 is zeroed by the switch 12 coupled in parallel therewith.

Generally, there are no requirements on the input signal. Any input signal is integrated and, if different from zero, results in a variable ramp signal. Specifically, at any moment, the integrator produces ramp signal having slope proportional to the input signal. It is further assumed for simplicity that the ADC input signal is constant. This results in a linearly changing output signal of the integrator, i.e. ramp signal having fixed rate.

The ramp signal is applied to a block having the structure of an ordinary flash ADC. Specifically, the ramp signal is applied to all comparators 16. Each comparator has a specific reference voltage deriving from the resistor network 15 which divides down the voltage of the reference source V. Therefore, values of the resistors 15 determine quantization levels of the comparators 16. The polarity of the comparator inputs is not essential. The analog section comprises K resistors 15 and K comparators 16. Thus, the comparator code produced thereby has K bits.

The comparator code is varying with the varying ramp signal. A digital section, shown hereafter, includes digital circuitry for converting outputs of the comparators 16 into the ADC output code. In producing the output code, the ADC of the present invention uses a plurality of samples of the comparator codes.

The digital section periodically samples the comparator codes, thus obtaining a code sequence. The quantization levels set by the resistor network 15 are chosen in such a manner that substantially different ADC input signals result in respective comparator code sequences having at least one different code. The following BASIC program calculates the quantization levels for ADC input signals increased by a unit which is an inherent quantizing error, e.g. the linearity error or 1 least significant bit (LSB). The input parameters are the ADC resolution N and number of samples M, whereas M−L+1 samples are effectively used. The program calculates the quantization levels and also comparator number K. The program has been optimized for the speed of execution.

defint i—n:N=6:M=15:L=3:P=2^N−1:dim s(999)
for S=1 to P:for j=M to L step−1:r=j*S:q=r−j
for i=K−1 to O step−1:i=q<s(i)and(r>=s(i)or i):next:j=j and−1=i
next if j>=0 then if S=P then cls else print S;:s(K)=M*S:K=K+1
next:print−N K M−L+1

The single ramp signal corresponding to the ADC input signal is converted by the comparators 16 into the comparator codes which are sampled by the digital section. By these means, the ramp signal is sampled and represented by the comparator codes. Value S is assigned to a ramp signal having a momentary value equal or greater than S and smaller than S+1. This is with reference to the full scale range equal P+1=64. The sampling of the comparator codes preferably starts on L-th rather than first clock pulse of a timing circuit since the initial part of the ramp signal is near zero and thus carries least accurate information about the ADC input signal. In the above example, the 6-bit ADC sampling M−L+1=13 times requires K=13 comparators, whereas the conversion is completed after M=15 clock pulses of the timing circuit.

An ordinary flash 6-bit ADC requires P=63 comparators and P resistors. The ADC of the present invention requires only K=13 comparators and K resistors due to a processing of a plurality of the comparator codes. The resistor network 15 determines quantization levels in such a manner that substantially different input signals, e.g. whose difference is at least 1LSB, result in respective comparator code sequences having at least one different code. The values of the resistors 15 are unequal but vary in a narrow range.

Figure 2:
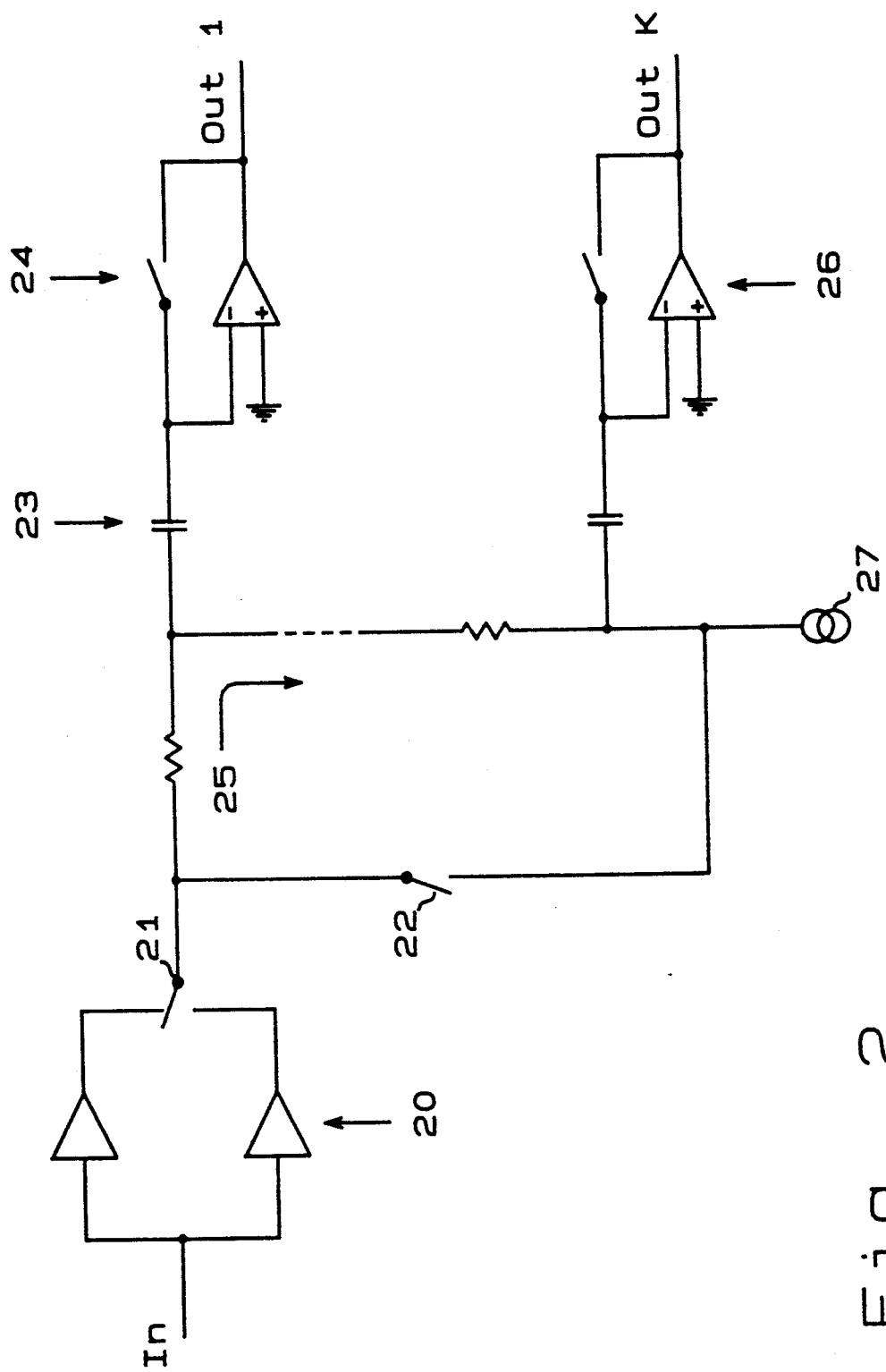
FIG. 2 is an embodiment of the analog section with a pair of integrators and autozeroing comparators.

FIG. 2 is an embodiment of the analog section with autozeroing comparators. The ADC input signal is applied to a pair of integrators 20 each of which can have the structure of the integrator shown in FIG. 1 as to provide a ramp signal at a rate determined by the ADC input signal. The resistor network 25 is coupled between the switch 21 and reference current source 27. While the ramp signal of one integrator is applied to the resistor network 25 via the switch 21, the other integrator is reset. Thereby, the reset does not increase the conversion time. Moreover, initial error voltages of both integrators 20 can be eliminated during an autozero operation of the comparators 26. Error voltage of an amplifier or comparator is a momentary value of its offset voltage which includes temperature dependence and input voltage level.

A very high resolution flash ADC is feasible only with an autozero circuit balancing error voltages of the comparators 26. The conventional ADCs demand three times more switches than comparators to perform the autozero operation. The autozero circuit of FIG. 2 comprises the switches 24 separately coupled between the inverting inputs and outputs of the comparators 26, and the capacitors 23 separately coupled in series with the inverting inputs. The comparators 26 are held at their switching points by closing the switches 24. Their error voltages are applied to the capacitors 23 and are further canceled out when the switches 24 open. In particular, the error voltage of each comparator appears at the inverting input thereof since the noninverting input is coupled to ground.

Before a new conversion, the switch 21 couples the resistor network 25 to the integrator still being reset. The switch 22 shorts out the resistor network 25 by coupling the source 27 to switch 21 so that the capacitors 23 are referenced to one voltage. The initial error voltage of the reset integrator is added to the voltages already stored in the capacitors 23 and further cancelled out when the switches 22 and 24 open. Moreover, this also includes on resistance of the switch 21 which results in a fixed voltage drop due to the constant current of the reference current source 27. Another switch can be employed to reconnect the current source 27 to the other terminal of switch 22 and thereby bypass on resistance thereof.

Figure 3:
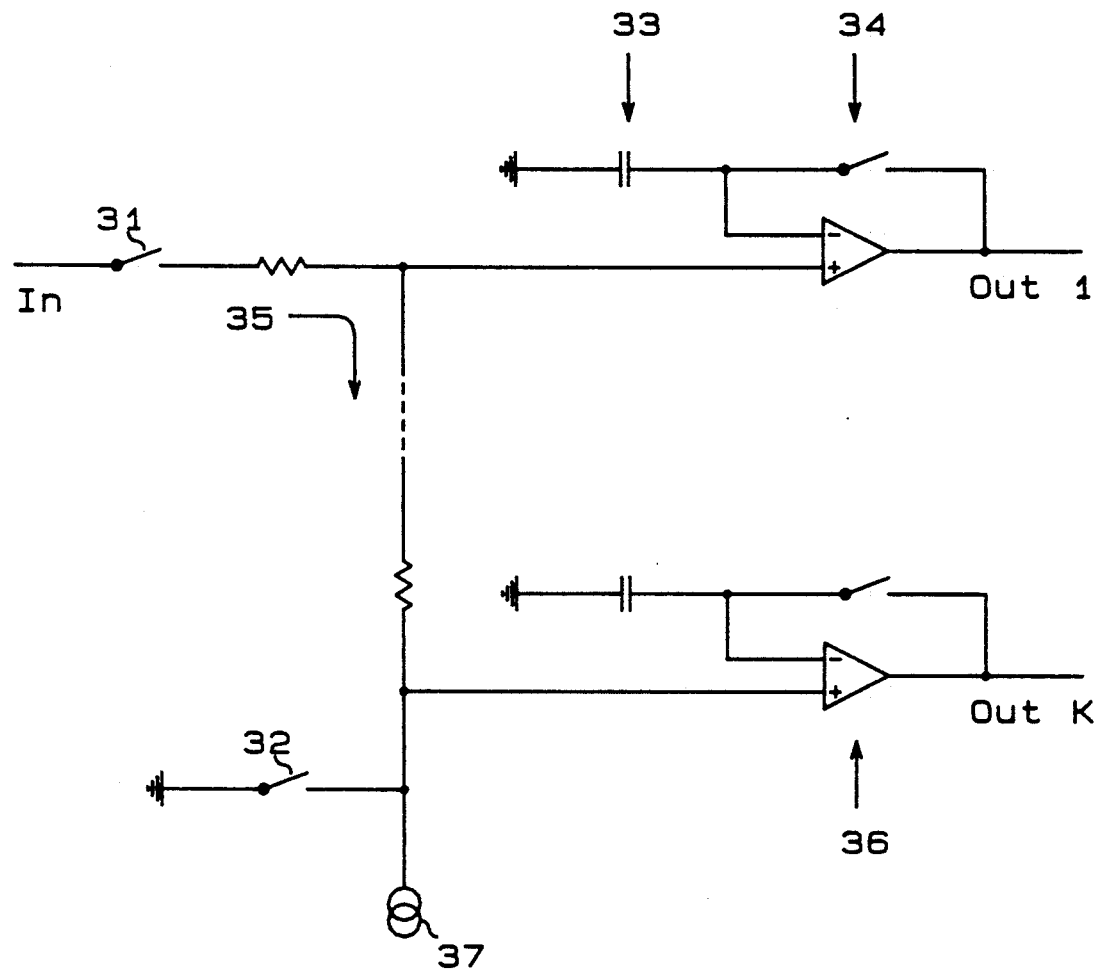
FIG. 3 is another embodiment of the analog section with autozeroing comparators.

FIG. 3 is another embodiment of the analog section with autozeroing comparators. Generally, the resistor network is coupled to a reference source and a first node for providing a plurality of reference signals. The comparators each have a first input coupled thereto and a second input coupled to a second node. The first and second nodes are separately coupled to the integrator and ground in either order. Specifically, in FIG. 1 the first and second nodes are coupled to ground and integrator respectively. The nodes are coupled in reverse order in FIGS. 2 and 3.

The autozero circuit of FIG. 3 comprises the switches 34 separately coupled between the inverting inputs and outputs of the comparators 36, and the capacitors 33 separately coupled in series with the inverting inputs, as in FIG. 2. Further comparison between FIG. 2 and 3 shows that the noninverting inputs of the comparators 34 can be exchanged for the terminals of the capacitors 33 now coupled to ground.

One or a pair of integrators can be coupled to the ADC input as shown in FIG. 1 or 2 respectively. The resistor network 35 is coupled between the ADC input via the switch 31 and the reference current source 37. During the autozero operation the noninverting inputs of the comparators 36 are referenced to ground. Specifically, the resistor network 35 is disconnected by the switch 31 on one end and coupled to ground via the switch 32 on the other end. The error voltages of the comparators 36 are stored by the respective capacitors 33 and are further canceled out when the switches 34 open. Similarly to the switch 22 of FIG. 2, the switch 31 can be also used to short out the resistor network 35 by coupling it to ground.

Figure 4:
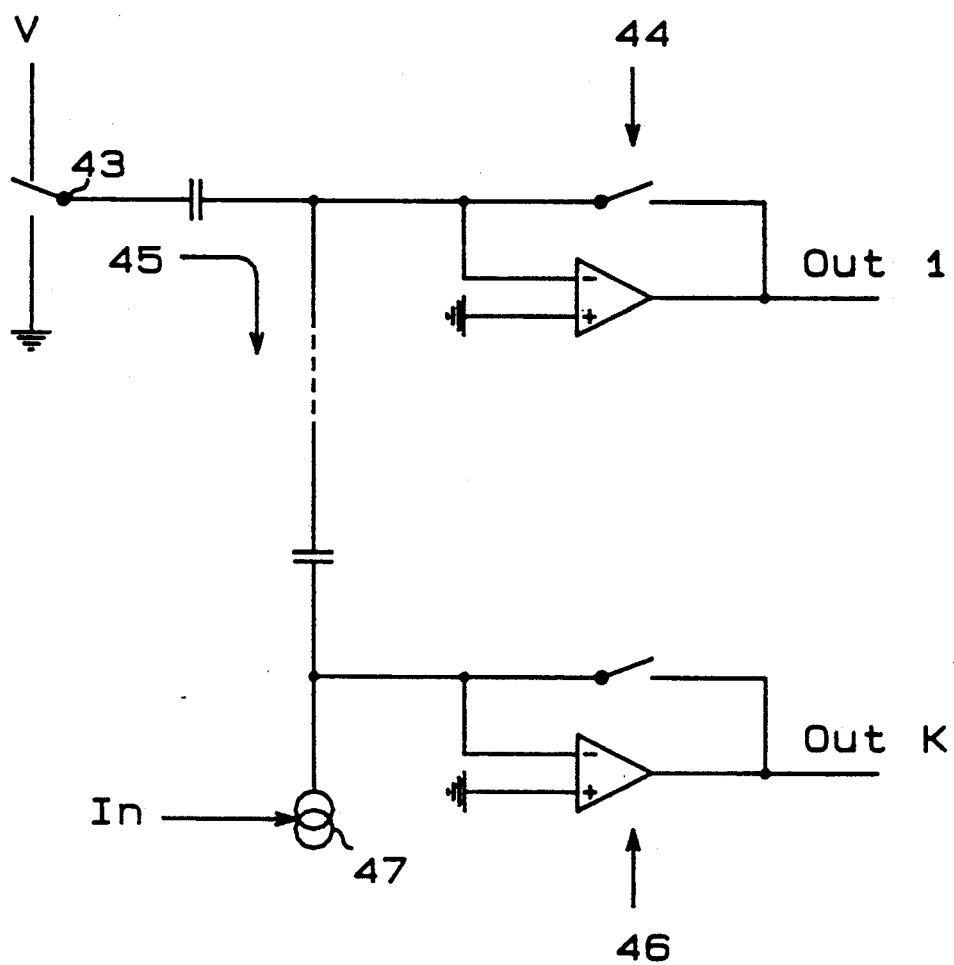
FIG. 4 is the preferred embodiment of the analog section with a capacitor network and an integrator consisting of a controllable current source.

FIG. 4 is the preferred embodiment of the analog section with a capacitor network and an integrator consisting of a controllable current source. The resistor network is unavoidable in conventional ADCs and causes deficient long term and temperature stability, reduced speed and accuracy, enlarged chip space and increased power consumption, etc. In contrast, integrated MOS capacitors are most accurate integrated circuit components. For instance, their absolute accuracy and tolerance fluctuation due to time, mechanical stress and voltage are far superior to any other component.

The ADC of FIG. 4 requires no resistor network. Moreover, the integrator consists of the controllable current source 47 which provides ramp signal due to a capacitive load. Specifically, the capacitor network 45 is coupled between the current source 47 and voltage source V via the switch 43.

The capacitor network 45 performs a multiple task. The current of the current source 47 is determined by the ADC input signal and flows thru all the capacitors 45 causing different voltage slopes. Specifically, the capacitance seen from the inverting input of each comparator is the result of the serial coupling of the capacitors connected between that input and the switch 43. The values of the capacitors 45 are determined as a result of the calculated quantization levels so that substantially different ADC input signals result in respective code sequences having at least one different comparator code.

The autozero operation is performed when the switch 43 couples the capacitor network 45 to ground in place of the reference voltage source V. The switches 44 are separately coupled between the inverting inputs and outputs of the comparators 46. The comparators 46 are held at their switching points by closing the switches 44. Their error voltages appearing at the inverting inputs are applied to the capacitors 45 and are further canceled out when the switches 44 open. Specifically, the capacitor connected to the switch 43 and respective comparator is charged to the error voltage thereof. Any other capacitor is charged to a voltage which is a difference of error voltages of two comparators coupled to this capacitor.

Figure 5:
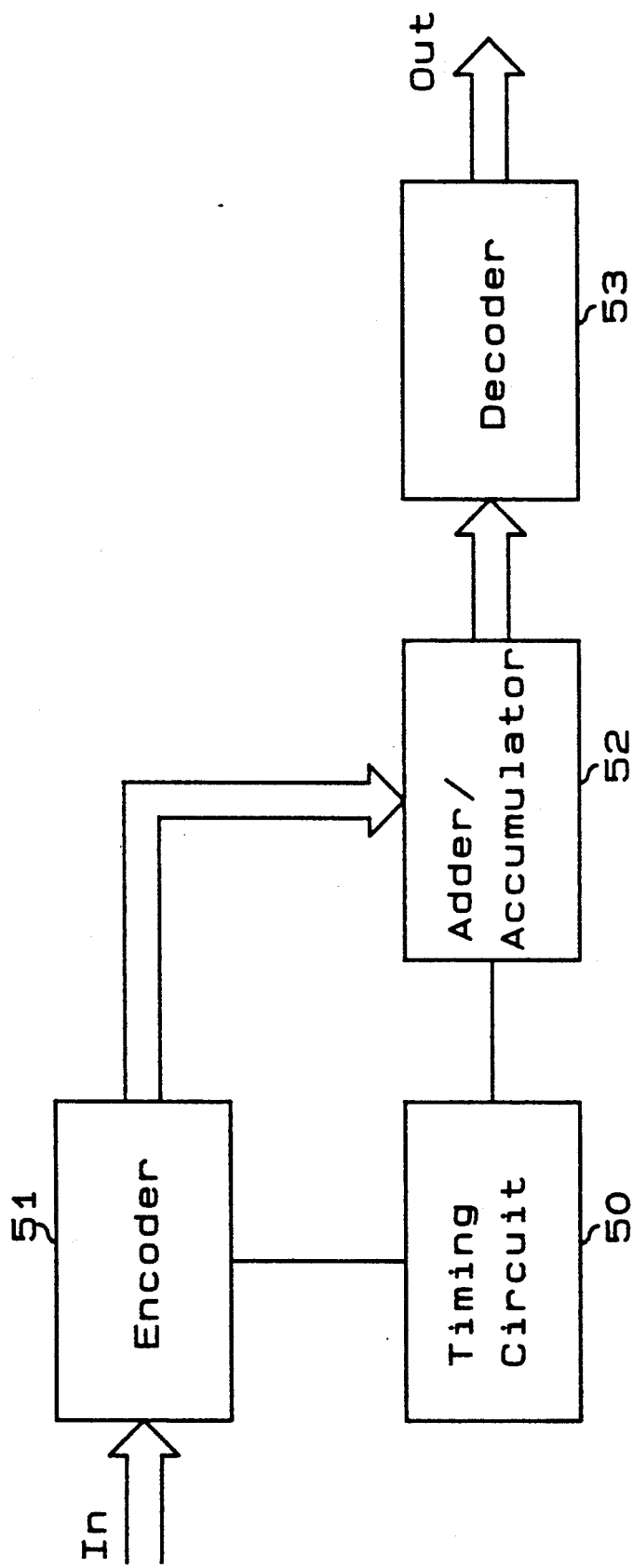
FIG. 5 is a basic structure of the digital section.

FIG. 5 is a basic structure of the digital section. The comparator code from the analog section of a flash ADC is called thermometer code as only one pair of adjacent bits is zero and one. The code must be sampled and stored as it is unstable due to changes of the ADC input signal, error voltages of the comparators, noise, etc. The encoder 51 is employed for sampling the comparator codes, correcting faulty codes and providing corresponding binary output codes. The encoder 51 encodes comparator code regardless of the quantization levels. Thus, an encoder for ordinary flash ADCs can be employed. The encoder disclosed in the abovementioned application Ser. No. 225,240 filed Jul. 28, 1988 and entitled "Encoder for Flash Analog-to-Digital Converters", by the same inventor, is recommended for a superior performance.

The encoder 51 periodically samples and converts the comparator codes into corresponding encoder codes. As pointed out hereinabove, the plurality of the comparator code samples sets up a code sequence. The resistor network of FIGS. 1 thru 3 or capacitor network of FIG. 4 determine quantization levels for the comparators so that substantially different ADC input signals, e.g. whose difference is at least 1LSB, result in respective comparator code sequences having at least one different code. Therefore, respective code sequences produced by the encoder 51 are also different. In particular, individual codes thereof differ at least once after an equal number of samples, whereby the code value of a higher ADC input signal is then higher.

The adder/accumulator 52 produces a sum of a plurality of the encoder codes, e.g. $M - L + 1$ in the above numeric example. The sum is unique for any two substantially different ADC input signals and therefore can be converted into proper ADC output code. Moreover, a digital integration is accomplished by virtue of the summing. For instance, some faulty comparator codes may be completely corrected. The digital integration is in addition to the analog integration.

The decoder 53, e.g. read only memory (ROM), converts the sum into the ADC output code and thereby restores the appropriate relation between the sum and quantization levels of the analog section. The decoder 53 is used only once during a conversion of the ADC input signal and can have a relatively high access time. The adder/accumulator 52 can store the final result, whereby a new sum can be obtained before the code is converted by the decoder 53 and the ADC output code remains stable.

The entire process is controlled by the timing circuit 50 which provides a clock signal to the encoder 51 and adder/accumulator 52 for the periodic sampling and processing the comparator code. The circuit 50 also resets an internal accumulator of the adder/accumulator 52 and provides control signals to the switches of the analog section.

Figure 6:
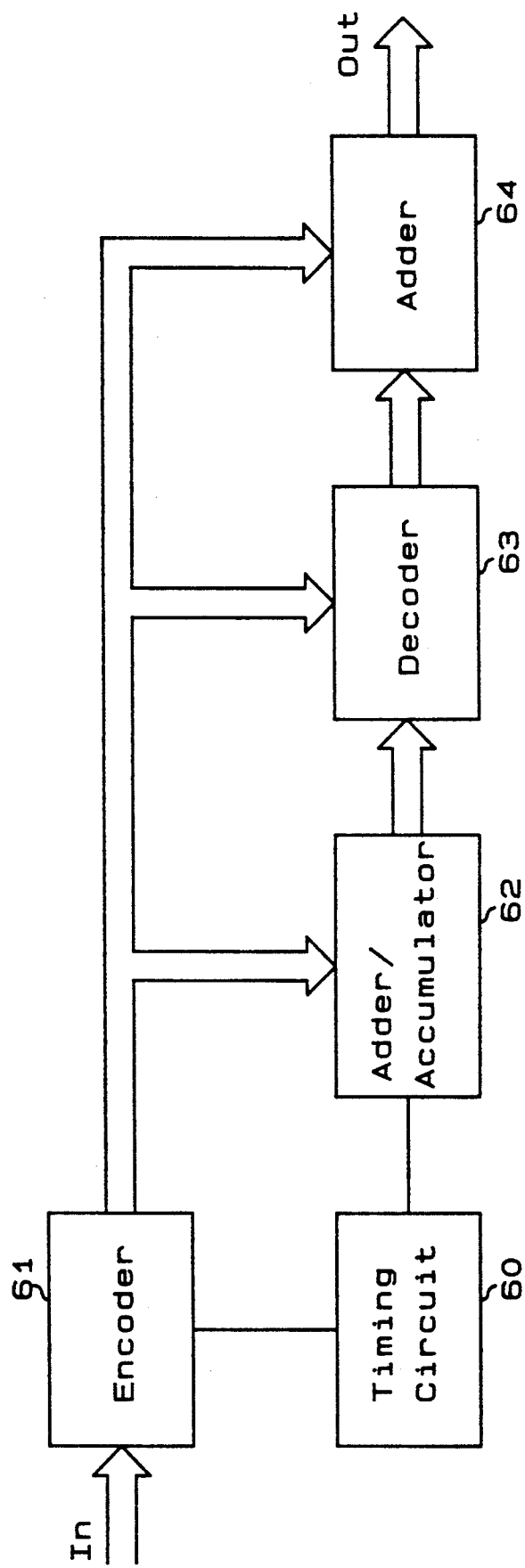
FIG. 6 is an embodiment of the digital section for high resolution ADC.

FIG. 6 is an embodiment of the digital section for high resolution ADC. A capacity of a ROM employed as decoder is reduced by reducing the number of input and output terminals thereof. Moreover, the adder/accumulator is less complex as only a portion of a code produced thereby is processed. The ADC output code is obtained from a sum of a segment and offset codes which represent respectively a corse and fine approximations of the ADC input signal.

The encoder 51 periodically samples and converts the comparator codes into corresponding encoder codes. As pointed out hereinabove, the initial part of the ramp signal is near zero and thus carries least accurate information about the ADC input signal. On the contrary, the final part of the ramp signal carries most accurate information as the ramp signal reaches its peak. Consequently, the final comparator code sampled by the encoder 51 and the corresponding final encoder code carry most accurate information about the ADC input signal. The final encoder code is therefore best suitable for the segment code of the ADC output code.

The adder/accumulator 62 produces the sum of the encoder codes, similarly to 52 of FIG. 5 embodiment. The segment code represents a coarse approximation of the ADC input signal. It is therefore necessary to process merely LSBs of the sum to distinguish substantially different ADC input signals. The decoder 63, e.g. ROM, is responsive to the segment code and LSBs of the sum for producing the offset code. The optional adder 64 adds the segment code and offset code, and provides the ADC output code.

The entire process is controlled by the timing circuit 60 which activates the encoder 61, adder/accumulator 62 and switches of the analog section, similarly to the circuit 50 of FIG. 5. All but final encoder codes can be added by the adder/accumulator since the final encoder code, i.e. the segment code, is already considered by the decoder 63 and adder 64. It shall be also pointed out that the adders are the only calculating units in present embodiments. No shift register, divider, multiplier, microprocessor, random access memory (RAM) are employed. Furthermore, no feedback exists in the digital section.

The choice of the quantization levels depends on operational speed so that nonlinearities of the integrator, propagation delay times of the comparators, etc. can be considered. Some additional comparators may be required for a reduction of the nonlinearity errors, ROM capacity, etc. This can be determined thru a computer simulation. A final trimming can be conducted in a packaged form of the ADC thru ROM programming.

The present invention represents a significant advance in the field of ADCs, in that it provides an ADC having a very high speed and resolution, drastically reduced number of components, high noise rejection, ability of averaging the input signal, inherent error correction, etc.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Analog-to-digital converter for converting input signal into output code, comprising:
   an integrator means for providing a ramp signal at a rate determined by the input signal;
   a source means for providing a reference signal;
   a first and second nodes separately coupled to the integrator means and ground in either order;
   a passive means coupled between the source means and first node for providing a plurality of signals;
   a plurality of comparator means for producing a comparator code, each comparator means having a first input receiving one of the passive means signals and a second input coupled to the second node; and
   a digital means for sampling and converting a plurality of the comparator codes into the output code.

2. Analog-to-digital converter of claim 1, wherein the passive means includes a resistor network.

3. Analog-to-digital converter of claim 2, wherein the integrator means includes:
   an operational amplifier having an inverting and non-inverting inputs coupled to the input signal and ground respectively, and output; and
   a capacitor means coupled between the output and inverting input for integrating a current applied thereto which current is determined by the input signal.

4. Analog-to-digital converter of claim 3, wherein the integrator means includes a resistor means coupled between the input signal and inverting input for attaining the current.

5. Analog-to-digital converter of claim 3, wherein the integrator means includes a switch means for zeroing the capacitor means.

6. Analog-to-digital converter of claim 2, wherein one of the inputs of each comparator means is an inverting input, and
   further wherein each comparator means includes:
   an output;
   a switch means coupled between the inverting input and output for attaining an error voltage of the comparator means at the inverting input; and
   a capacitor means coupled in series with the inverting input for storing the error voltage.

7. Analog-to-digital converter of claim 6, wherein the integrator means includes a second switch means for resetting the integrator means.

8. Analog-to-digital converter of claim 6, further including a second switch means for coupling the source means to the first node.

9. Analog-to-digital converter of claim 1, wherein the integrator means includes a current source means for providing a current determined by the input signal,
- further wherein the passive means includes a capacitor network, and
- still further wherein the first and second nodes are coupled to the integrator means and ground respectively.

10. Analog-to-digital converter of claim 9, wherein the first input of each comparator means is an inverting input, and
- further wherein each comparator means includes:
- an output; and
- a switch means coupled between the inverting input and output for attaining an error voltage of the comparator means at the inverting input.

11. Analog-to-digital converter of claim 10, wherein the source means includes a second switch means for coupling the passive means to ground.

12. Analog-to-digital converter of claim 1 further including:
- a second integrator means for providing a second ramp signal at a rate determined by the input signal; and
- a switch means for applying said first or second ramp signal to the respective node.

13. Analog-to-digital converter of claim 1, wherein the plurality of the comparator code samples sets up a code sequence, and
- further wherein the passive means determines quantization levels for the comparator means so that substantially different input signals result in respective code sequences having at least one different comparator code.

14. Analog-to-digital converter of claim 1, wherein the digital means includes:
- an encoder means for sampling and converting the comparator code into an encoder code;
- an adder/accumulator means for producing a sum of a plurality of the encoder codes; and
- a decoder means for converting the sum into the output code.

15. Analog-to-digital converter of claim 14, wherein the decoder means is also responsive to one encoder code.

16. Analog-to-digital converter of claim 15, further including an adder means for adding the one encoder code and the code produced by the decoder means, and providing the output code.

17. Analog-to-digital converter of claim 14, wherein the decoder means includes a read only memory.

* * * * *